United States Patent
Banks et al.

(10) Patent No.: US 8,556,681 B2
(45) Date of Patent: Oct. 15, 2013

(54) ULTRA SMOOTH FACE SPUTTER TARGETS AND METHODS OF PRODUCING SAME

(75) Inventors: Terry L. Banks, Grove City, OH (US); David B. Smathers, Columbus, OH (US)

(73) Assignee: Tosoh SMD, Inc., Grove City, OH (US)

( * ) Notice: Subject to any disclaimer, the term of this patent is extended or adjusted under 35 U.S.C. 154(b) by 986 days.

(21) Appl. No.: 12/448,148

(22) PCT Filed: Jan. 29, 2008

(86) PCT No.: PCT/US2008/001145
§ 371 (c)(1), (2), (4) Date: Nov. 23, 2009

(87) PCT Pub. No.: WO2008/127493
PCT Pub. Date: Oct. 23, 2008

(65) Prior Publication Data
US 2010/0105296 A1    Apr. 29, 2010

Related U.S. Application Data

(60) Provisional application No. 60/898,159, filed on Jan. 29, 2007.

(51) Int. Cl.
*B24B 1/00* (2006.01)

(52) U.S. Cl.
USPC .................................. 451/59; 451/60; 451/38

(58) Field of Classification Search
USPC .............. 451/59, 38, 60; 204/298.12, 298.13; 216/52–53, 88–92
See application file for complete search history.

(56) References Cited

U.S. PATENT DOCUMENTS

| | | |
|---|---|---|
| 3,521,412 A | 7/1970 | McCarty |
| 3,593,410 A * | 7/1971 | Taylor .............................. 29/557 |
| 3,634,973 A | 1/1972 | McCarty |
| 3,802,128 A | 4/1974 | Minear, Jr. et al. |
| 3,819,343 A | 6/1974 | Rhoades |
| 4,422,035 A | 12/1983 | Risko |
| 4,482,860 A | 11/1984 | Risko |
| 4,563,238 A | 1/1986 | Rhoades |
| 4,656,788 A | 4/1987 | Rhoades et al. |
| 4,681,600 A | 7/1987 | Rhoades et al. |
| 4,754,115 A | 6/1988 | Rhoades |
| 4,766,389 A | 8/1988 | Rhoades et al. |
| 4,870,743 A | 10/1989 | Gilmore |
| 4,891,916 A | 1/1990 | Rhoades et al. |
| 4,895,592 A * | 1/1990 | Hatwar et al. ............... 75/10.14 |

(Continued)

FOREIGN PATENT DOCUMENTS

| | | |
|---|---|---|
| JP | 59190363 | 10/1984 |
| JP | 03257158 | 11/1991 |

OTHER PUBLICATIONS

Solutions: Polishing and Surface Finishing—2007 (1 page) www.extrudehone.com/polish_surface_finish.html.

(Continued)

*Primary Examiner* — George Nguyen
(74) *Attorney, Agent, or Firm* — Wegman, Hessler & Vanderburg

(57) ABSTRACT

A method is provided to remove a thickness of a sputter target surface deformation layer to thereby achieve a reduced burn-in time during sputtering operations. The method comprises extrusion hone polishing of the target surface with a visco-elastic abrasive medium.

19 Claims, 5 Drawing Sheets

(56) References Cited

U.S. PATENT DOCUMENTS

| | | | |
|---|---|---|---|
| 4,908,574 A | 3/1990 | Rhoades et al. | |
| 4,936,057 A | 6/1990 | Rhoades | |
| 4,995,949 A | 2/1991 | Rhoades | |
| 4,996,796 A | 3/1991 | Rhoades | |
| 5,054,247 A | 10/1991 | Rhoades et al. | |
| 5,070,652 A | 12/1991 | Rhoades et al. | |
| 5,076,027 A | 12/1991 | Rhoades | |
| 5,085,068 A | 2/1992 | Rhoades et al. | |
| 5,114,548 A | 5/1992 | Rhoades | |
| 5,125,191 A | 6/1992 | Rhoades | |
| 5,187,899 A | 2/1993 | Rhoades | |
| 5,189,377 A | 2/1993 | Rhoades et al. | |
| 5,202,008 A * | 4/1993 | Talieh et al. | 204/192.32 |
| 5,225,038 A | 7/1993 | Rhoades | |
| 5,248,077 A | 9/1993 | Rhoades et al. | |
| 5,367,833 A | 11/1994 | Rhoades et al. | |
| 5,517,124 A | 5/1996 | Rhoades et al. | |
| 5,679,058 A | 10/1997 | Rhoades | |
| 5,735,335 A | 4/1998 | Gilmore et al. | |
| 5,964,644 A | 10/1999 | Rhoades | |
| 6,024,852 A * | 2/2000 | Tamura et al. | 204/298.12 |
| 6,030,514 A * | 2/2000 | Dunlop et al. | 204/298.12 |
| 6,153,315 A * | 11/2000 | Yamakoshi et al. | 428/687 |
| 6,242,351 B1 * | 6/2001 | Li et al. | 438/690 |
| 6,273,787 B1 | 8/2001 | Gilmore et al. | |
| 6,284,111 B1 | 9/2001 | Takahashi et al. | |
| 6,288,154 B1 | 9/2001 | Rhoades | |
| 6,309,556 B1 * | 10/2001 | Joyce et al. | 216/100 |
| 6,432,825 B1 * | 8/2002 | Torii | 438/692 |
| 6,500,050 B2 | 12/2002 | Walch et al. | |
| 6,503,126 B1 | 1/2003 | Rhoades | |
| 6,544,110 B2 | 4/2003 | Gilmore et al. | |
| 6,585,930 B2 | 7/2003 | Liu et al. | |
| 6,645,056 B1 | 11/2003 | Gilmore et al. | |
| 6,701,529 B1 | 3/2004 | Rhoades et al. | |
| 6,713,016 B2 | 3/2004 | Kaercher et al. | |
| 6,719,883 B2 | 4/2004 | Stimson | |
| 6,746,506 B2 | 6/2004 | Liu et al. | |
| 6,878,640 B2 * | 4/2005 | Voutsas et al. | 438/753 |
| 6,905,395 B2 | 6/2005 | Walch | |
| 6,918,937 B2 | 7/2005 | Gilmore et al. | |
| 6,953,387 B2 | 10/2005 | Greenslet et al. | |
| 7,044,842 B2 | 5/2006 | Rhoades | |
| 7,255,631 B2 | 8/2007 | Rhoades | |
| 2001/0047931 A1 * | 12/2001 | Xie et al. | 204/192.11 |
| 2003/0087588 A1 | 5/2003 | Rhoades | |
| 2005/0066411 A1 | 3/2005 | Matechen | |
| 2005/0092609 A1 | 5/2005 | Gosger et al. | |
| 2005/0118931 A1 | 6/2005 | Greenslet et al. | |
| 2005/0263390 A1 | 12/2005 | Gung et al. | |
| 2006/0205329 A1 | 9/2006 | Rhoades | |
| 2006/0229003 A1 | 10/2006 | Rhoades | |
| 2007/0007699 A1 | 1/2007 | Rynerson et al. | |
| 2007/0215463 A1 | 9/2007 | Parkhe | |
| 2007/0297938 A1 | 12/2007 | Takahashi | |

OTHER PUBLICATIONS

U.S. Appl. No. 60/782,740, filed Mar. 14, 2006—Pre-Conditioning a Sputtering Target Prior to Sputtering, Applied Materials, Inc.

* cited by examiner

ULTRA SMOOTH FACE SPUTTER TARGETS AND METHODS OF PRODUCING SAME

CROSS-REFERENCE TO RELATED APPLICATION

This application claims the priority benefit of U.S. Provisional Patent Application No. 60/898,159 filed Jan. 29, 2007.

FIELD OF INVENTION

The invention relates to methods of improving the surface roughness (Ra) and cleanliness of a sputter target surface by removal of the target surface deformation layer. Additionally, surface contamination is minimized, including such contamination that is caused by dielectric materials. Consequently, initial sputtering performance is improved and particulate emissions during target "burn in" are minimized. The invention also pertains to targets made by such methods.

BACKGROUND OF THE INVENTION

Cathodic sputtering is widely used for the deposition of thin layers of material onto desired substrates. Basically, this process requires a gas ion bombardment of the target having a face formed of a desired material that is to be deposited as a thin film or layer on a substrate. Ion bombardment of the target not only causes atoms or molecules of the target material to be sputtered, but imparts considerable thermal energy to the target. This heat is dissipated by use of a cooling fluid typically circulated beneath or around a backing plate that is positioned in heat exchange relation with the target.

The target forms a part of a cathode assembly which together with an anode is placed in an evacuated chamber that contains an inert gas, preferably argon. A high voltage electrical filed is applied across the cathode and anode. The inert gas is ionized by collision with the electrons ejected from the cathode. Positively charged gas ions are attracted to the cathode and, upon impingement with the target surface, dislodge the target material. The dislodged target materials transverse the evacuated enclosure and deposit as a thin film on the desired substrate that is normally located proximate the anode.

The targets may comprise metals such as, for example, aluminum, copper, tantalum, titanium, or tungsten. The materials from the target itself may be sputter coated onto the substrate or, in some cases, compounds formed from the target material and a process gas may be formed on the desired substrate. Examples of this "reactive" sputtering include tantalum nitride, titanium nitride, and tungsten nitride compounds that are coated onto the desired substrate during the sputtering process. Typically, the sputtering chamber comprises a housing which encloses a process zone into which the process gas, such as $N_2$, is admitted during the reactive sputtering process.

Fabrication methods by which targets are manufactured typically create a damaged surface layer of the target that produces undesirable or inconsistent sputtering properties. For example, machining of the target surface requires shearing force exertion on the target surface that can plastically deform and create other defects in the surface grains. These defects results in variable and non-uniform sputtering properties across the target surface.

Normally, a target "burn in" step is used to remove the undesirable damaged surface layer of the target. This burn in step is performed in the sputter chamber with the target exposed to the excited plasma gas to result in sputtering off of the undesirable surface layer. Obviously, this burn in process is costly in terms of energy expenditure and sputtering chamber down time.

A variety of attempts have been made to remove the undesirable target surface deformation later such as by grinding, electropolishing, chemical etching and chemical/mechanical polishing (CMP). Grinding processes often result in the deposition of embedded media in the target surface with electropolishing and chemical etching potentially resulting in target surface $H_2$ retention. CMP processes produce sludge that can contaminate other surfaces.

SUMMARY OF THE INVENTION

The inventors have found that substantially the entire layer of the undesired target surface damaged or deformed layer can be removed by an extrusion honing process utilizing a fluidized, visco-elastic abrasive medium. Accordingly, the target achieves a reduced burn-in time during sputtering operations. In the extrusion honing process, a relative motion between the target surface and visco-elastic abrasive medium is provided. This motion may be characterized by linear, cyclic, oscillatory, gyratory, and/or orbital motion.

Target surfaces provided by the methods may have surface roughnesses of less than about 5 μm, preferably less than 2, and most preferably less than 1 μm. Further, the extrusion honed target surfaces are substantially free of foreign particles that may otherwise exist along the surface during the polishing process.

The process may be used in conjunction with a host of target materials including copper, tantalum, niobium, tungsten, titanium, zirconium, hafnium, aluminum, nickel, cobalt, platinum, and alloyed versions thereof. Further, the target surface may comprise any desired cross-sectional shape such as a concave, convex, planar, and extreme deep dish drawn shape. Further, the target surface, after extrusion honing in accordance with the invention, is substantially free of hydrogen contamination.

The visco-elastic abrasive medium (VEAM) comprises abrasive particles dispersed throughout the medium. These particles may be selected from diamonds, carbides, alumina, silica, and garnet. Preferred carbides include silicon carbide, boron carbide, and tungsten carbide. Preferably, the VEAM comprises either a polymer gel or a poly(borosiloxane) material. Most preferably, the VEAM is a rheopectic material.

Although the invention will be described to a large extent in conjunction with its use for preparation of sputter target surfaces, the artisan will appreciate that it can be used to prepare the surfaces of other components of conventional sputtering systems such as an RF coil surface area.

The invention will be further described in conjunction with the following detailed description and in the appended drawings.

DETAILED DESCRIPTION

In accordance with the invention, sputtering targets, and RF coils of the type adapted to generate plasma in sputtering systems, may be extrusion hone polished to have surface roughnesses of less than 5, preferably less than 2, and most preferably less than 1 µm. Further, due to the use of a visco-elastic abrasive medium (VEAM) in the polishing process, the finished, polished surfaces are free of contaminating debris that otherwise may occur during the polishing processes. The process removes substantially the entire thickness of the undesirable deformation layer from the sputter target surface so as to improve initial sputtering uniformity with resulting decreased target "burn-in" time. Since the VEAM forms an elastic solid when under stress caused by the polishing process, it retains contaminating abrasive and other particles from the process. Thus, the resulting target surfaces are substantially free from contamination and do not pick up or retain hydrogen.

Figure 1:
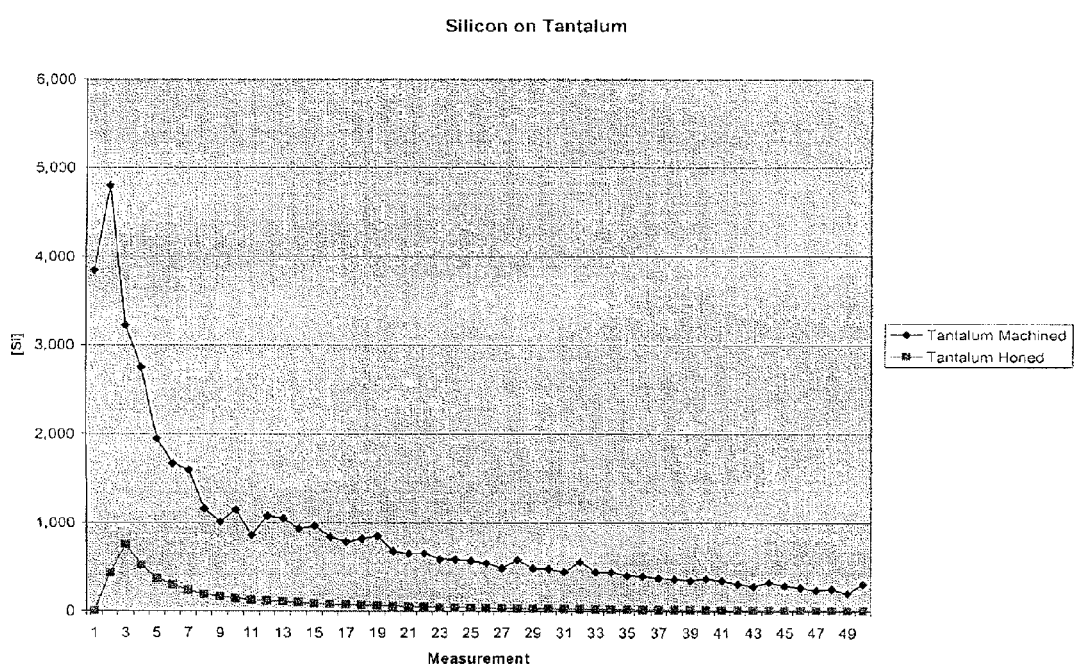
FIG. 1 is a chart showing glow discharge mass spectrometry (GDMS) analysis at different surface levels of a tantalum target prepared with an extrusion honed (XH) surface treatment using a Si/C containing visco-elastic abrasive medium (VEAM) compared to a conventional machining process (CMP)
Figure 2:
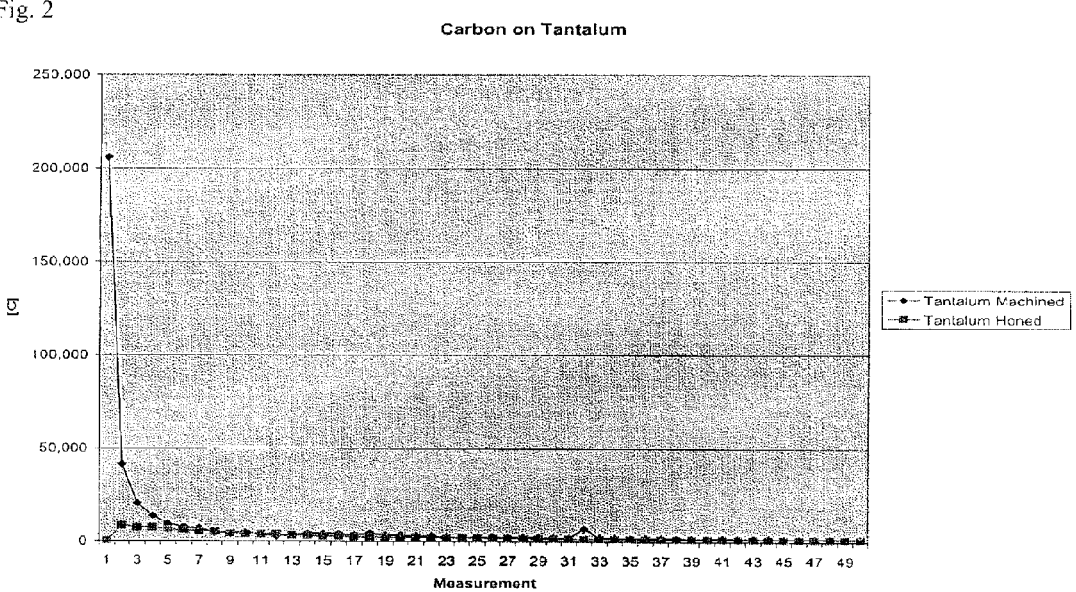
FIG. 2 is a chart showing a GDMS analysis at different surface levels of a tantalum target prepared with an XH surface treatment using a diamond containing VEAM in accordance with the invention as compared to a CMP.
Figure 3:
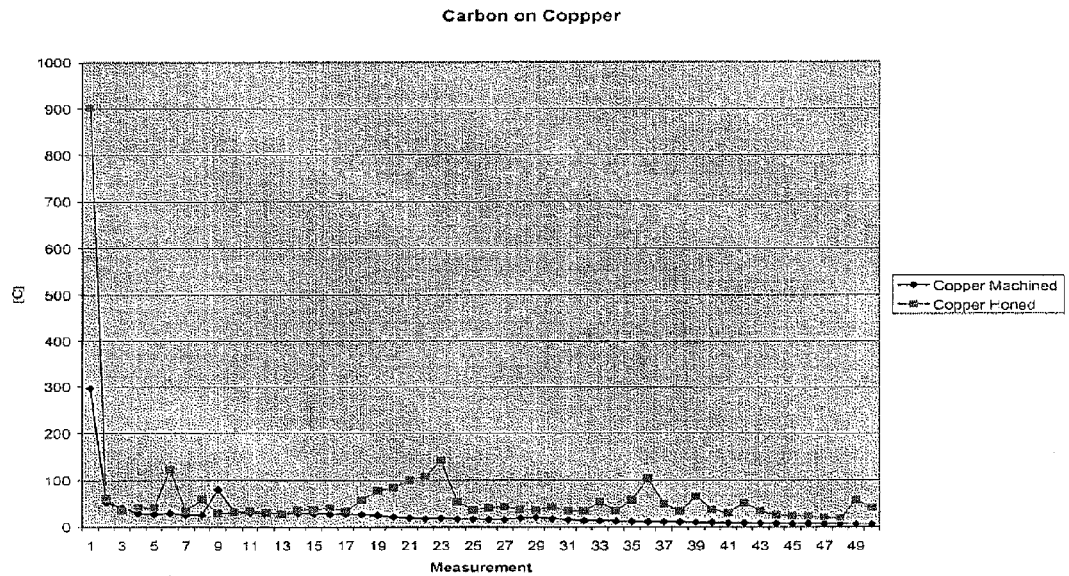
FIG. 3 is a chart showing a GDMS analysis at different surface levels of a Cu target prepared with an XH surface treatment using a diamond containing VEAM in accordance with the invention as compared to a CMP.
Figure 4:
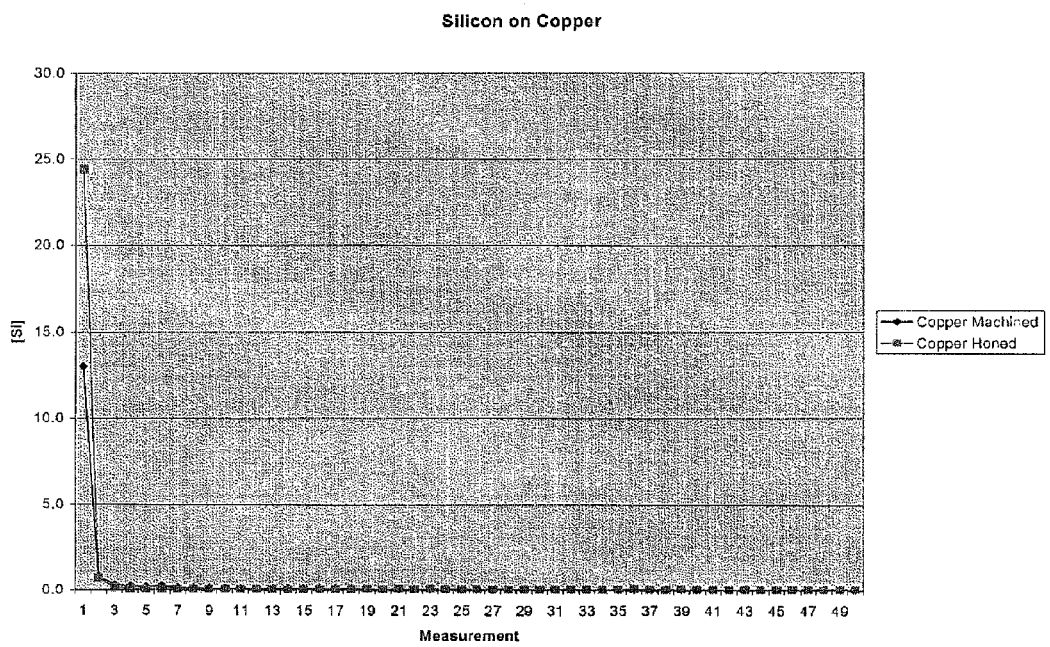
FIG. 4 is a chart showing a GDMS analysis at different surface levels of a Cu target prepared with an XH surface treatment using an Si/C containing VEAM in accordance with the invention as compared to a CMP.
Figure 5:
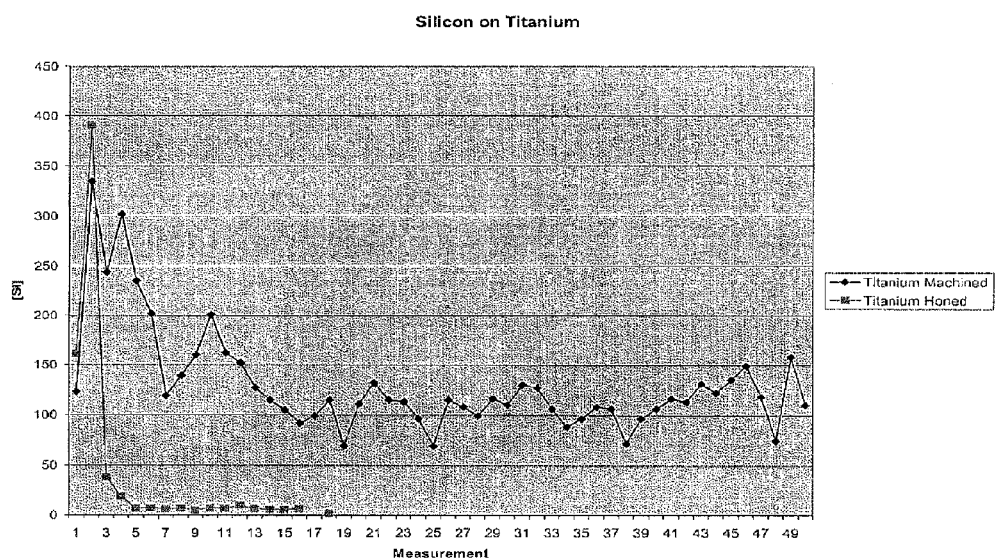
FIG. 5 is a chart showing a GDMS analysis at different surface levels of a Ti target prepared with an XH surface treatment using a Si/C containing VEAM in accordance with the invention as compared to a CMP.
Figure 6:
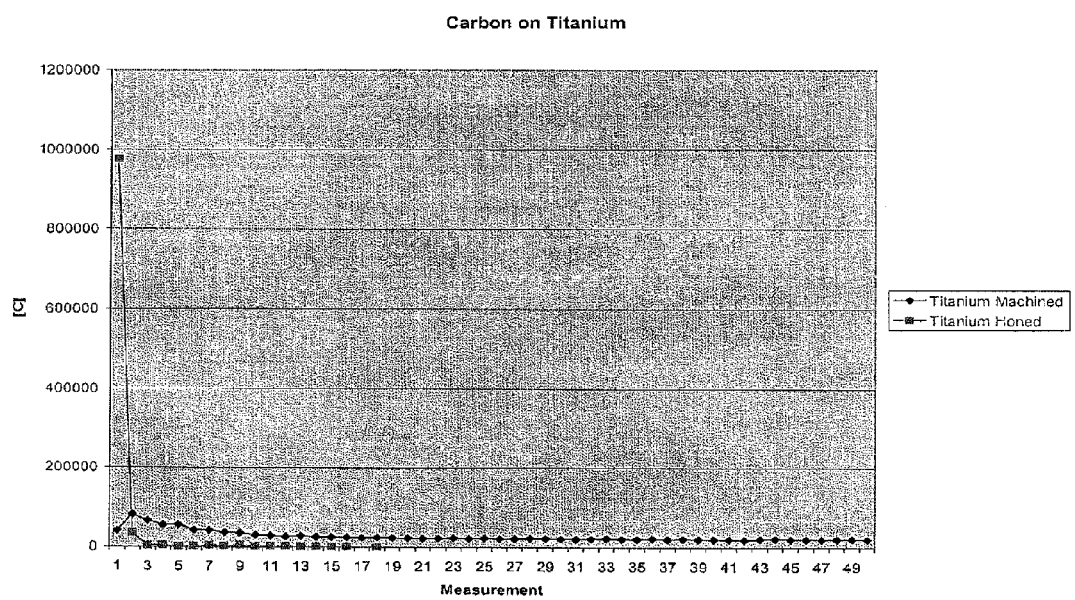
FIG. 6 is a chart showing a GDMS analysis at different surface levels of a Ti target prepared with an XH surface treatment using a diamond containing VEAM in accordance with the invention as compared to a CMP.
Figure 7:
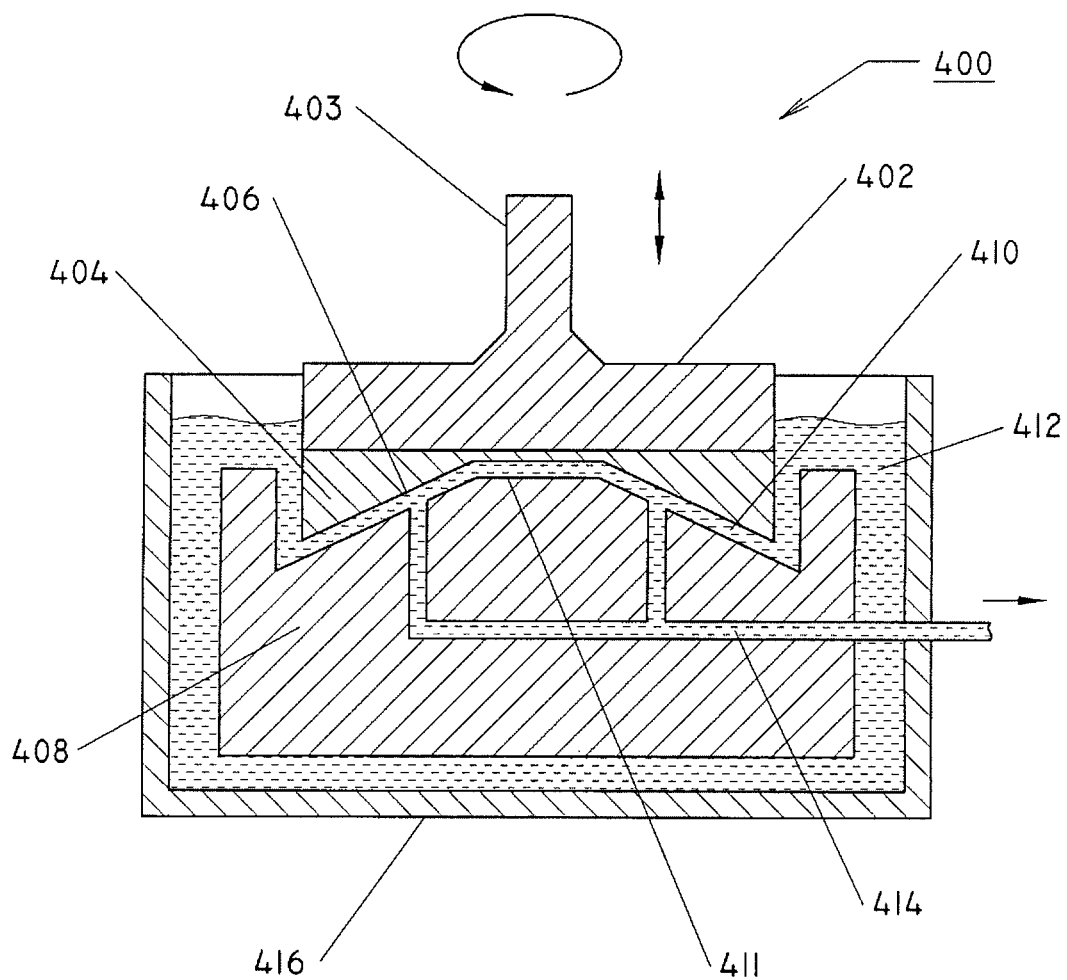
FIG. 7 is a schematic cross-sectional view of one embodiment of an apparatus adapted to treat a sputter target in accordance with the invention.

Turning initially to FIG. 7, there is shown one embodiment of an apparatus of the type that may be used to polish a target surface or RF coil in accordance with the invention. This apparatus is substantially the same as shown and described in U.S. Pat. No. 6,273,787, the entire disclosure of which is hereby incorporated by reference. An extrusion honing apparatus 400 is shown in diagrammatic cross section and comprises a fixture 402 and integral shaft 403 with the fixture being adapted for rotation as shown by the circular arrow above the shaft. A target such as a sputter target 404 is mounted to the end of the fixture by conventional mechanism such as bolts or clamps, not shown. The target comprises a surface 406 which, during the sputtering process, will be bombarded with ions from the sputtering plasma, resulting in ejection of the material from the surface 406 onto the desired substrate. It is this surface 406 which is polished in accordance with the invention. As shown in this figure, the target is provided with a concave shape, but the process can be adapted to polish any surface shape from planar to deep drawn bowl shapes.

A displacer 408 is positioned in opposition to the target face and has a top surface 411 which, in preferred embodiments, is a complementary, rough mirror image of the cross-sectional configuration of the target face 406. The fixture and displacer are both contained within a vessel 416, and a VEAM abrasive 412 is admitted into the container to flow along the narrow gap or channel 410 that is formed between the adjacent faces of the target and the displacer. Effluent channels 414 are provided so as to allow exit of the spent visco-elastic medium after it has performed its intended polishing function. Additionally, as shown by the arrows on the right hand side of fixture 403, the fixture is also provided with means for imparting relative linear motion thereto such as by a ball screw or the like, not shown. The fixture 402 can thereby be rotated and/or pressed closely into the gap 410 so as to apply pressure to the VEAM as it is circulated through the gap. The visco-elastic abrasive medium is carried across the surface of the target and conforms to the target surface during the polishing operation. As is stated in U.S. Pat. No. 6,273,787, the polishing action is based on an "extrusion" of the visco-elastic abrasive medium through the narrow gap existing between the target and displacer.

As is pointed out in U.S. Pat. No. 6,273,787, the VEAM behaves predominantly as an elastic solid at the applied strain of the working motion. As such, the solid cleans the surface and retains polishing contaminants that would otherwise form along the interfacial surfaces of the target and displacer, and these contaminants are then removed with the spent medium as it exits through effluent channel 414. The orbital drive component as shown by the circular arrows in FIG. 7 and the vertical drive component as shown by the linear arrow on the right side of the fixture serve to engage the target surface with visco-elastic abrasive medium in a working, contact motion. As is stated in U.S. Pat. No. 6,273,787, the relative motion drive will desirably be operated at relatively small amplitude requiring relative motion, typically an orbital motion at relatively high frequency rates. As per the '787 patent, typical operating parameters include an amplitude of motion (that is orbital radius) of about 0.010 to about 0.500 inches, preferably about 0.040 to 0.0250 inches operating at a frequency of about 5 to 100 Hz, preferably about 12-25 Hz. Oscillation directions can be CW, CCW, or mixed. The container shown in FIG. 7 is an open container, but the artisan will appreciate that closed containers can also be used.

The visco-elastic material or base into which the desired abrasive media are added, may preferably be either a polymer gel, particularly a hydrogel, or the medium can comprise a poly(borosiloxane). This contrasts to water based slurries that have traditionally been used as a polishing medium.

The particle size of the abrasive component of the visco-elasto abrasive medium should be on the order of about 1 µm to about 2,000 µm with a preferred abrasive grain size being in the range of about 2 to 400 µm and most preferably from about 20 to about 300 µm. Examples of suitable materials for the abrasive particles are alumina, silica, garnet, silicon carbide, boron carbide, diamond, tungsten carbide, and the like. In general, the abrasive will desirably be employed in the medium at a concentration of about 30 to 90 wt %, preferably about 65 to 85 wt % based on the total weight of the visco-elastic abrasive medium.

At present, it is preferred to utilize a poly(borosiloxane) polymer as the visco-elastic medium. This polymer is described as being "rheopectic"; i.e., it increases in apparent viscosity with applied stress. The static viscosity of the visco-elastic medium with abrasive particles therein is desirably from about $n=2\times10^4$ centipoise to about $n=8\times10^6$ centipoise.

In accordance with the invention, the relative motion imparted between the target and the medium may be described as an orbital, gyratory, rotary, reciprocating linear motion, or the resultant of a combination of two or more such motions.

Figure 8:
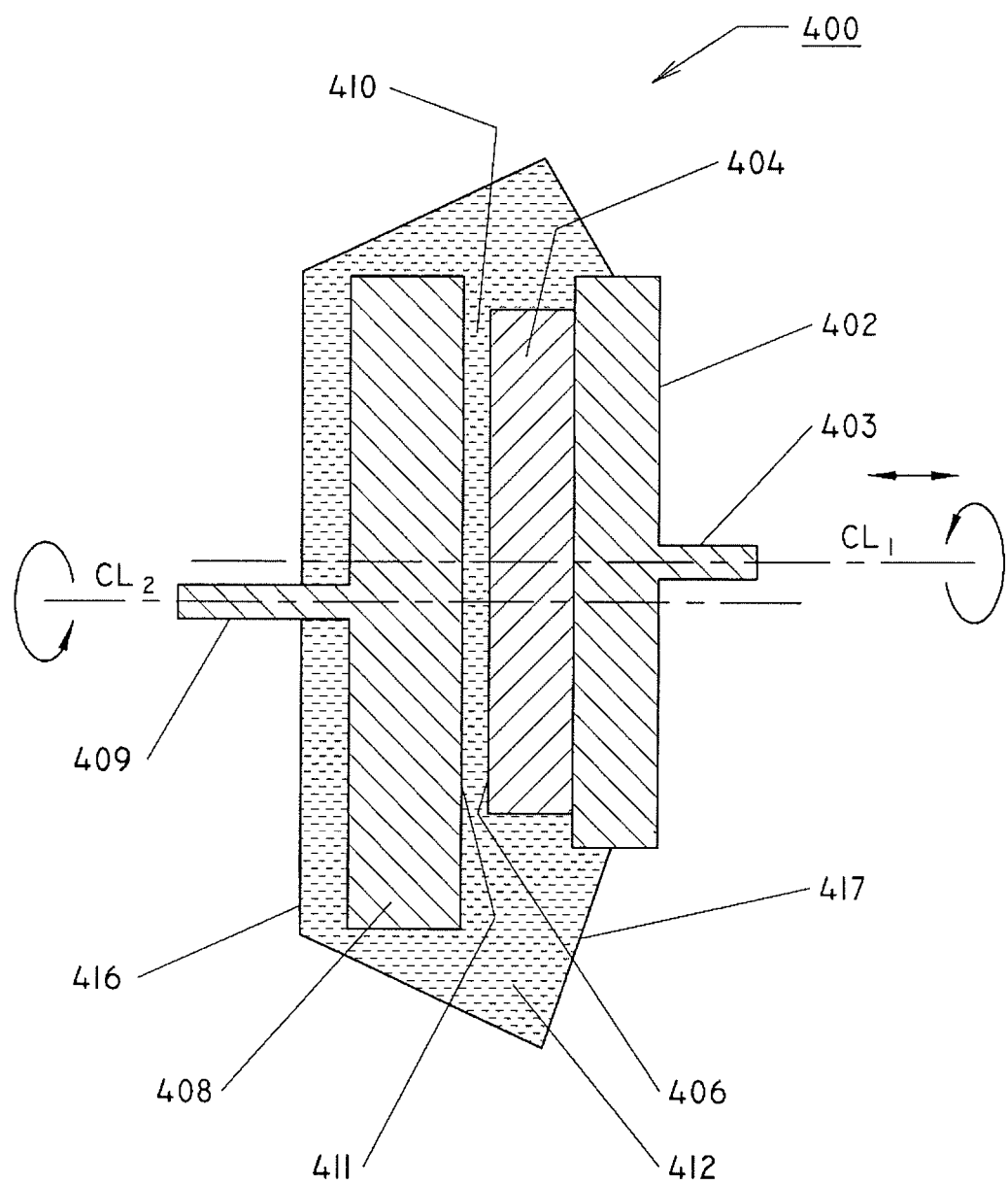
FIG. 8 is a schematic cross-sectional view of another embodiment of an apparatus adapted to treat a sputter target in accordance with the invention.

Turning now to FIG. 8 of the invention, there is shown a preferred apparatus for performing the methods of the invention. As shown in FIG. 8, the fixture 402 and target 404 carried thereby are again both adapted for linear or rotational motion. The rotation of the fixture is provided along rotational axis $CL_1$.

In the embodiment shown in FIG. 8, the displacer 408 is also rotatable on its shaft 409 about axis $CL_2$ which is parallel to axis $CL_1$ but offset therefrom. In other words, the axes $CL_1$ and $CL_2$ exist in the same plane but are not coaxial. $CL_1$ and $CL_2$ are offset and upon rotation of the shafts 403, 409 provide an orbital polishing motion as the VEAM is brought into contact with the target face 406 in the narrow gap 410 between the displacer 408 and target face 406. Typically, the gap is from about 1/64-1/2 inch depth (distance between target surface and displacer) and preferably between 1/32 and 1/8 inch. A relatively eccentric motion is provided between the target and the displacer upon offset rotation of the target and displacer around the axes $C_1$ and $C_2$, respectively. The apparatus schematically depicted in FIG. 8 is described in more detail in U.S. Pat. No. 7,255,631, the disclosure of which is hereby incorporated by reference. In the embodiment shown in the '631 patent, the VEAM is admitted into the contained surface through a cylindrical shaft that rotates the displacer with spent VEAM exiting the system through apertures or the like in the portion of the fixture exposed to the medium. Although the FIG. 8 embodiment indicates that both the fixture and displacer may be rotatable, the displacer can be stationary with the offset between $CL_1$ and $CL_2$ still present. In other words, eccentricity may exist between $CL_1$ and $CL_2$ with the fixture rotating about axis $CL_1$ and with linear fore and aft provided as the fixture is brought toward and away from the displacer surface.

EXAMPLES

The invention will be further described in the following examples which are to be regarded as illustrations of the invention and should not be viewed to limit the scope of the invention.

Ta, Ti, and Cu targets were subjected to XH processes in accordance with the invention and compared to similar targets that were processed via conventional methods which included machining and mechanical polishing (sanding) steps. The so-treated targets were subjected to GDMS analysis at varying target depths to analyze the presence of contaminants on the target. A round sample, approximately 1 inch in diameter was prepared and placed in a flat cell GDMS test. The sample is sputtered slowly and the atoms removed from the surface are counted as they pass through a mass spectrometer.

Results of these studies are graphically displayed in FIGS. 1-6. The X axis in each of the graphs depicts the target surface level or thickness along the surface at which the contaminants were analyzed. The Y axis represents the ppm content of contaminants that are present on the surface as it is removed. In each sample, it can be seen, especially at the target surface level or at layers closely beneath the surface, that contaminant levels are drastically reduced when the XH processes are used in comparison to the conventional treatments. Scanning Electron Microscope analysis of the surfaces shows that the conventional preparation leaves a rough surface which can hold contaminants while the honed surface is smooth and free of laps.

The foregoing description and disclosure of the present invention is intended to be illustrative for the guidance of those of ordinary skill in the art to which the invention pertains and is not intended to define or limit the scope of the invention. The scope of the invention is defined and limited only in the following claims.

What is claimed is:

1. A method for treating a sputter target surface to remove a thickness of a surface deformation layer including contaminants to thereby achieve a reduced burn-in time during sputtering comprising extrusion hone polishing said target surface by, contacting said target surface with a rheopectic viscoelastic abrasive medium (VEAM) containing abrasive particles and imparting relative motion between said target surface and said medium to thereby extrusion hone polish said target surface, said VEAM retaining said abrasive particles and contaminants, and removing said VEAM from contact with said target surface.

2. A method as recited in claim 1 wherein said motion is cyclic.

3. A method as recited in claim 1 wherein said motion is oscillatory.

4. Method as recited in claim 1 wherein after said polishing said target has a surface roughness of less than about 5 microns and is substantially free of contaminant particles from said polishing.

5. Method as recited in claim 1 wherein said target comprises a member selected from the group consisting of copper, tantalum, niobium, tungsten, titanium, zirconium, hafnium, aluminum, nickel, cobalt, platinum, and alloys thereof.

6. Method as recited in claim 1 wherein said sputter target has a concave shape.

7. Method as recited in claim 1 wherein, after said polishing, said target is substantially free of hydrogen contamination.

8. A method as recited in claim 1 wherein said VEAM comprises abrasive particles selected from the group consisting of diamonds, carbides, alumina, silica, and garnet.

9. A method as recited in claim 8 wherein said carbides are chosen from silicon carbide, boron carbide, and tungsten carbide.

10. A method as recited in claim 8 wherein said abrasive particles range from about 1 to 2,000 μm in diameter.

11. A method as recited in claim 1 wherein said VEAM comprises a member selected from the group consisting of polymer gels and poly(borosiloxanes).

12. A method as recited in claim 11 wherein said VEAM behaves predominantly as an elastic solid at the applied strain of said polishing.

13. A method as recited in claim 12 wherein said medium has a static viscosity of from about $n=2 \times 10^4$ centipoise to about $n=8 \times 10^6$ centipoise and wherein abrasive particles are present in said VEAM in an amount of about 30-90 wt % based upon the weight of said VEAM.

14. Method as recited in claim 1 further comprising
providing a rotatable fixture and mounting said target thereon;
providing a displacer member adjacent said target and forming a gap between said target surface and said displacer member;
and feeding said VEAM into said gap whereby said target surface will be polished.

15. Method as recited in claim 14 further comprising providing relative linear motion between said target surface and said displacer member.

16. Method as recited in claim 14 further comprising rotating said target surface relative to said displacer member.

17. Method as recited in claim 16 further comprising linearly moving said target and said displacer member toward and away from each other during said rotating.

18. Method as recited in claim 14 further comprising rotating said displacer member, providing a first axis of rotation for said rotatable fixture and a second axis of rotation for said displacer member, said first and second axis being parallel to each other but offset from each other whereby upon rotation of both said fixture and said displacer an orbital polishing of said target surface is provided.

19. A method for extrusion hone polishing of a radio frequency coil of the type having a surface layer including contaminants, said radio frequency coil adapted for use in plasma generation in a sputtering chamber comprising contacting said surface layer with a rheopectic visco-elastic abrasive medium (VEAM) containing abrasive particles and imparting relative motion between said surface layer and said medium, said VEAM retaining said abrasive particles and contaminants, and removing said VEAM from contact with said coil surface.

* * * * *